(12) United States Patent
Yeh et al.

(10) Patent No.: US 10,379,155 B2
(45) Date of Patent: Aug. 13, 2019

(54) IN-DIE TRANSISTOR CHARACTERIZATION IN AN IC

(71) Applicant: Xilinx, Inc, San Jose, CA (US)

(72) Inventors: Ping-Chin Yeh, San Jose, CA (US); John K. Jennings, Dublin (IE); Rhesa Nathanael, Emeryville, CA (US); Nui Chong, Cupertino, CA (US); Cheang-Whang Chang, Mountain View, CA (US); Daniel Y Chung, San Ramon, CA (US)

(73) Assignee: XILINX, INC., San Jose, CA (US)

( * ) Notice: Subject to any disclaimer, the term of this patent is extended or adjusted under 35 U.S.C. 154(b) by 609 days.

(21) Appl. No.: 14/505,240

(22) Filed: Oct. 2, 2014

(65) Prior Publication Data
US 2016/0097805 A1 Apr. 7, 2016

(51) Int. Cl.
*G01R 31/28* (2006.01)
*G01R 31/3167* (2006.01)

(52) U.S. Cl.
CPC ..... *G01R 31/2851* (2013.01); *G01R 31/2837* (2013.01); *G01R 31/3167* (2013.01); *G01R 31/2843* (2013.01)

(58) Field of Classification Search
CPC ...... G01R 31/26–3016; G01R 31/3167; G01R 31/3187–31937; G01K 7/015; H01L 22/20–34
See application file for complete search history.

(56) References Cited

U.S. PATENT DOCUMENTS

| | | | | |
|---|---|---|---|---|
| 5,502,333 A | * | 3/1996 | Bertin | H01L 22/22 257/685 |
| 5,561,367 A | * | 10/1996 | Goettling | G01R 31/2853 324/750.3 |
| 6,137,728 A | * | 10/2000 | Peng | G11C 16/0441 257/321 |
| 6,169,503 B1 | * | 1/2001 | Wong | H03M 1/361 341/136 |
| 6,222,212 B1 | * | 4/2001 | Lee | H01L 21/6835 257/207 |
| 6,764,867 B1 | * | 7/2004 | Stephens, Jr. | H01L 22/20 257/E21.525 |
| 6,939,752 B1 | * | 9/2005 | Liu | H01L 27/0288 257/347 |
| 7,227,364 B1 | * | 6/2007 | Fan | G01R 31/31717 324/528 |
| 8,040,148 B2 | * | 10/2011 | Satoh | G01R 31/2818 324/754.03 |

(Continued)

*Primary Examiner* — Huy Q Phan
*Assistant Examiner* — David B Frederiksen
(74) *Attorney, Agent, or Firm* — Robert M. Brush

(57) ABSTRACT

In an example implementation, an integrated circuit (IC) includes: a plurality of transistors disposed in a plurality of locations on a die of the IC; conductors coupled to terminals of each of the plurality of transistors; a digital-to-analog converter (DAC), coupled to the conductors, to drive voltage signals to the plurality of transistors in response to a digital input; and an analog-to-digital converter (ADC), coupled to at least a portion of the conductors, to generate samples in response to current signals induced in the plurality of transistors in response to the voltage signals, the samples being indicative of at least one electrostatic characteristic for the plurality of transistors.

16 Claims, 7 Drawing Sheets

(56) References Cited

U.S. PATENT DOCUMENTS

| | | | |
|---|---|---|---|
| 8,595,561 B1* | 11/2013 | Lu | G06F 11/3648 714/25 |
| 2004/0006755 A1* | 1/2004 | Swanson | H01L 22/22 438/10 |
| 2004/0103354 A1* | 5/2004 | Mark | G01R 31/2853 714/725 |
| 2005/0242836 A1* | 11/2005 | Goetting | G01R 31/3167 326/39 |
| 2006/0242504 A1* | 10/2006 | Kadota | G01R 31/31907 714/725 |
| 2007/0237207 A1* | 10/2007 | Aslan | G01K 7/015 374/178 |
| 2009/0108337 A1* | 4/2009 | Luo | H01L 27/0251 257/328 |
| 2009/0218407 A1* | 9/2009 | Rofougaran | G06K 19/0724 235/492 |
| 2009/0273053 A1* | 11/2009 | Baer | H01L 27/0207 257/528 |
| 2010/0079159 A1* | 4/2010 | Kemmerling | G01R 1/07385 324/762.01 |
| 2011/0068820 A1* | 3/2011 | Fox | G01R 31/3016 326/16 |
| 2011/0181312 A1 | 7/2011 | Ouslis | |
| 2012/0179410 A1 | 7/2012 | Montrose | |
| 2014/0081586 A1 | 3/2014 | Boglione | |
| 2016/0047775 A1* | 2/2016 | Roop | G01N 27/4148 204/406 |

\* cited by examiner

IN-DIE TRANSISTOR CHARACTERIZATION IN AN IC

TECHNICAL FIELD

Examples of the present disclosure generally relate to integrated circuits and, in particular, to in-die transistor characterization in an integrated circuit.

BACKGROUND

Integrated circuits (ICs) are tested during fabrication to maintain device quality. Wafer acceptance testing (WAT) is one technique used to test for performance of a wafer having a plurality of ICs formed thereon. The WAT technique includes providing several test structures distributed in a peripheral region of the wafer, such as within scribe lines between ICs. During testing, a tester drives selected test structures with test signals to test different properties of the wafer, such as transistor characteristics. WAT is performed on the wafer prior to sorting and packaging of the ICs.

With WAT, since the test structures are disposed in peripheral regions of the wafer (e.g., within a scribe line), the test structures do not directly test characteristics of the ICs themselves. Typically, only a limited number of test structures are formed on the wafer (i.e., less than the number of ICs) in order to reduce testing time during manufacture. Moreover, ICs can undergo additional processing/testing steps after sorting and/or packaging, such as high-temperature operating life (HTOL) tests and the like, where it can be beneficial to further test characteristics of the ICs. WAT techniques cannot be used to test ICs once separated from the wafer.

SUMMARY

In-die transistor characterization in an integrated circuit is described. In an example implementation, an integrated circuit (IC) includes: a plurality of transistors disposed in a plurality of locations on a die of the IC; conductors coupled to terminals of each of the plurality of transistors; a digital-to-analog converter (DAC), coupled to the conductors, to drive voltage signals to the plurality of transistors in response to a digital input; and an analog-to-digital converter (ADC), coupled to at least a portion of the conductors, to generate samples in response to current signals induced in the plurality of transistors in response to the voltage signals, the samples being indicative of at least one electrostatic characteristic for the plurality of transistors.

In another example implementation, a system to test an integrated circuit (IC) includes: a plurality of transistor modules disposed in a plurality of locations on a die of the IC; a control circuit on the IC and coupled to the plurality of transistor modules, configured to drive the plurality of transistor modules to obtain test measurements; and a test circuit on the IC and coupled to the control circuit, configured to derive transistor characteristics from the test measurements.

In another example implementation, a method of testing an integrated circuit (IC) includes: driving voltage signals to a plurality of transistors disposed in a plurality of locations on a die of the IC using a digital-to-analog converter (DAC) on the IC; generating samples in response to induced current signals in the plurality of transistors in using an analog-to-digital converter (ADC) on the IC; and deriving at least one electrostatic characteristic for the plurality of transistors from the samples.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
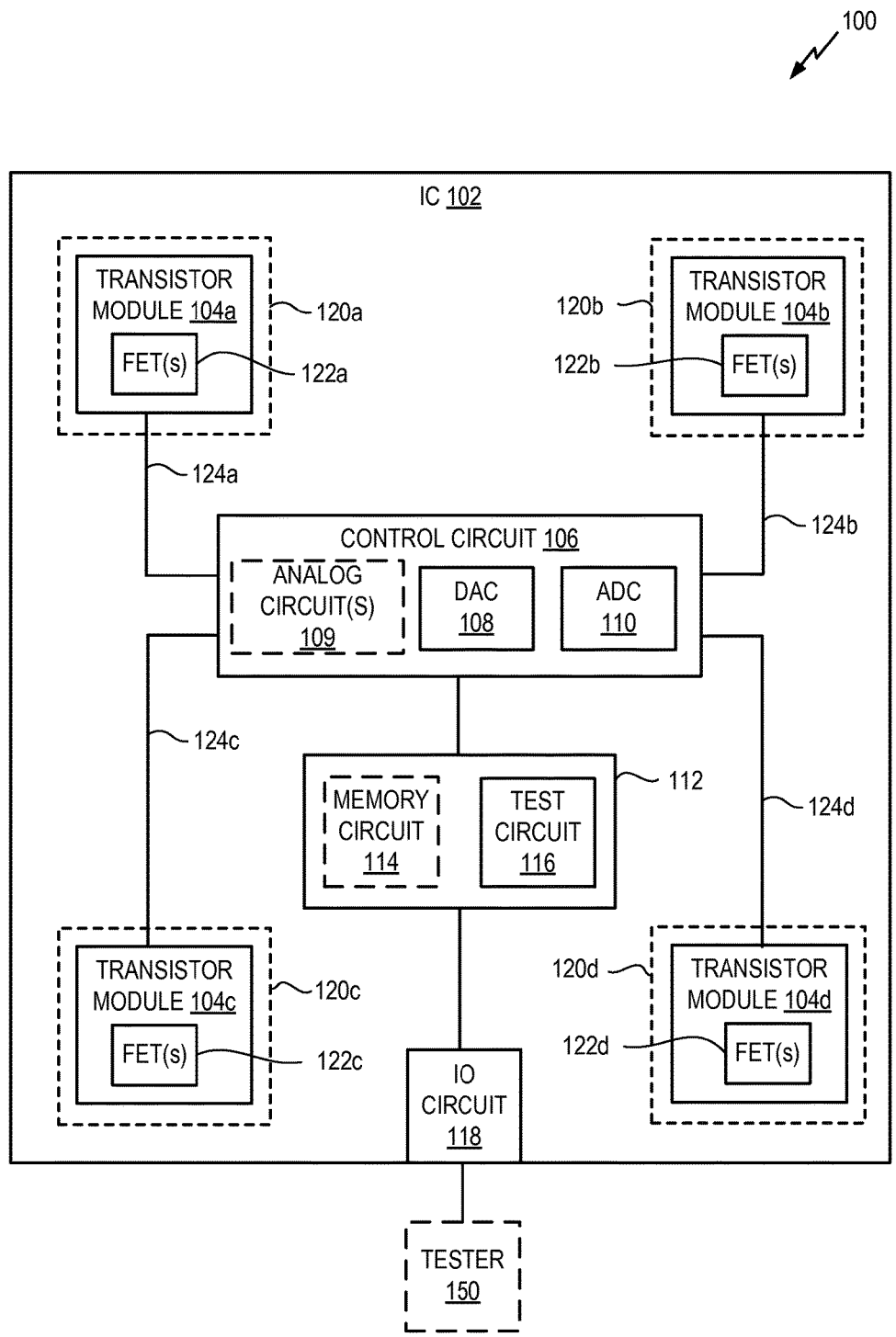
FIG. 1 is a block diagram depicting an IC test system according to an example implementation.

In-die transistor characterization in an integrated circuit is described. In an example implementation, an integrated circuit (IC) includes a plurality of transistor modules disposed in a plurality of locations on the die of the IC. Each transistor module can include one or more transistors formed on the die. The transistor(s) in each transistor module can be dedicated for the purpose of characterization, or can be a functional part of circuitry on the IC. A control circuit is implemented on the IC that drives the transistors in the modules with voltage signals and measures induced current signals or signals derived from induced current signals. Transistor characteristics can be derived from the test measurements, including various electrostatic characteristics, such as current-voltage relationships, charge-voltage relationships, threshold voltages, capacitance, resistance, or the like.

In some examples, a tester can be implemented on the IC as a test circuit that cooperates with the control circuit to drive the transistor modules, obtain test measurements, and derive transistor characteristics. In some examples, test measurements and/or derived transistor characteristics can be stored on the IC within a memory circuit. In some examples, the control circuit, test circuit, and/or memory circuit can cooperate with an external tester. The external tester can retrieve transistor characteristics from the IC, or can retrieve test measurements from which transistor characteristics can be derived. ICs can be tested individually or while on a wafer.

In some examples, the IC can be a programmable IC, such as a field programmable gate array (FPGA), complex programmable logic device (CPLD), or like type programmable IC having a defined set of programmable resources. The transistor modules can be disposed in a plurality of locations on the die of the programmable IC. The control circuit can be coupled to the transistor modules by conductors formed on the die. The conductors can be dedicated connections to the transistor modules, or part of programmable interconnect of the programmable IC. By using programmable interconnect, the control circuit can be selectively coupled to the transistor modules to drive and obtain test measurements. In one example, a test circuit that cooperates with the control circuit can be configured in programmable logic of the programmable IC. In another example, the test circuit can be a dedicated circuit formed on the die of the programmable IC. In one example, the control circuit includes a digital-to-analog (DAC) converter for driving the transistor modules, and an analog-to-digital converter (ADC) for sampling current or charge to obtain test measurements. In an example, the DAC and ADC can be leveraged from existing circuitry formed on the die of the programmable IC, such as system monitor circuitry.

The in-die transistor characterization described herein allows for measurements to be taken at several locations of the IC die itself. This allows for transistor characterization across the die to account for die-variation. Some examples of the in-die transistor characterization are performed entirely within the IC leveraging existing resources, and do not require dedicated test interfaces or dedicated test voltage supplies. Further, in-die transistor characterization can be performed at any time, including after ICs have been sorted and packaged. This allows transistor characterization to be performed after IC-level tests, such as HTOL, or even after use of the IC in the field. These and further aspects of the in-die transistor characterization can be understood with reference to the following description.

FIG. 1 is a block diagram depicting an IC test system 100 according to an example implementation. The IC test system 100 includes an IC 102. The IC 102 can be disposed on a wafer alongside other similar ICs, or the IC 102 can be separated from a wafer (e.g., sorted and packaged). The IC 102 can be any type of IC, including a programmable IC, an application specific integrated circuit (ASIC), or the like. The IC 102 includes a plurality of transistor modules, such as transistor modules 104a through 104d (collectively "transistor modules 104"). The transistor modules 104 are disposed in a respective plurality locations on the die of the IC 102, such as die locations 120a through 120d corresponding to transistor modules 104a through 104d, respectively (collectively "die locations 120"). Each of the transistor modules 104 includes a set of transistors having at least one transistor, such as transistor sets 122a through 122d corresponding to transistor modules 104a through 104d (collectively "transistors 122"). In an example, the transistors 122 include field effect transistors (FETs) that are commonly used in the fabrication of ICs, such as metal-oxide semiconductor FETs (MOSFETs) or the like. In general, the transistors 122 can include various transistor types in addition to MOSFETs, such as bipolar junction transistors (BJTs), junction FETs (JFETs), metal-semiconductor FETs (MESFETs), or the like.

The IC 102 further includes a control circuit 106. The control circuit 106 is coupled to the transistors 122 in the transistor modules 104 by sets of conductors having a plurality of conductors, such as conductor sets 124a through 124d corresponding to transistor modules 104a through 104d (collectively "conductors 124"). In an example, the control circuit 106 can include a digital-to-analog converter (DAC) 108 and an analog-to-digital converter (ADC) 110. The DAC 108 can be coupled to the conductors 124 to drive voltage to the transistors 122 of the transistor modules 104 in response to a digital input (e.g., a control input controlling voltage levels, timing, etc.). The DAC 108 can drive a voltage signal onto a plurality of terminals of each transistor. The voltage signals can be constant, substantially constant, or time varying. The ADC 110 can be coupled to at least a portion of the conductors 124 to generate samples of induced current signals generated by the transistors 122.

In another example, the control circuit 106 can include one or more analog circuits ("analog circuit(s) 109") configured to process the induced current signals prior to sampling by the ADC 110. The analog circuit(s) 109 can be coupled to at least a portion of the conductors 124 to receive the induced current signals. The ADC 110 can be coupled to the analog circuit(s) 109 to sample output analog signals. The analog circuit(s) 109 can perform various types of analog signal processing, such as integration, analog filtering, and/or like types of analog signal conditioning. The analog circuit(s) 109 can generate other analog signals derived from the induced current signals, such as charge signals. Thus, the ADC 110 can sample the induced current signals directly, or can sample output of the analog circuit(s) 109, which can be analog signals derived from the induced current signals. In general, the control circuit 106 drives the transistors 122 with voltage signals and obtains test measurements in response to induced current signals. The test measurements can include samples of current, charge, or the like derived from induced current, as well as combinations of such samples. The terms "test measurements", "measurements", "test samples", and "samples", as well as the singular forms thereof, are used synonymously herein.

The IC 102 further includes circuit(s) 112 coupled to the control circuit 106. In an example, the circuit(s) 112 include a test circuit 116. The test circuit 116 is configured to receive test measurements from the control circuit 106. The test circuit 116 can perform various functions depending on the complexity of the circuit. In one example, the test circuit 116 relays the test measurements to another circuit or device and/or stores the test measurements. In another example, the test circuit 116 is configured to derive transistor characteristics from the test measurements. "Transistor characteristics" is meant to encompass any type of electrostatic characteristic of a particular transistor, such as current-voltage relationships, charge-voltage relationships, threshold voltages, capacitance, resistance, and the like. Measurements of a given transistor characteristic can exhibit variation from one transistor module to another transistor module, or from one set of FETs to another set of FETs, located in different areas of the die of the IC 102. For example, a measurement of a transistor characteristic of a FET 122a in the location 120a can exhibit variation from a measurement of the same transistor characteristic of a FET 122b in the location 120b.

In an example, the circuit(s) 112 also include a memory circuit 114. The memory circuit 114 can store the test measurements and/or data indicative of transistor characteristics derived from the test measurements. The memory circuit 114 can comprise a non-volatile memory so that the data can be maintained in the IC 102 in the absence of power. In an example, the memory circuit 114 can comprise one-time programmable non-volatile memory, such as a programmable read only memory (PROM) or the like. In another example, the memory circuit 114 can comprise a dynamically programmable non-volatile memory, such as an erasable programmable read only memory (EPROM) or the like. The memory circuit 114 is not limited to a non-volatile memory, and can include volatile memory (e.g., random access memory (RAM)) for temporary storage of test measurements and/or transistor characteristics.

The test circuit 116 can also cooperate with the control circuit 106 to initiate tests in order to obtain current measurements. The test circuit 116 can cooperate with other circuits either within the IC 102 or external to the IC 102 to control when tests are performed and test measurements obtained.

The IC 102 can further include an input/output (10) circuit 118. The circuit(s) 112 can be coupled to the 10 circuit 118. The 10 circuit 118 can be used to obtain test measurements and/or transistor characteristics from the IC 102 (e.g., directly from the test circuit 116, or as stored by the memory circuit 114). In an example, an external tester ("tester 150") can be coupled to the 10 circuit 118 to obtain the test measurements and/or transistor characteristics. The tester 150 can also drive the test circuit 116 to initiate tests. The tester 150 can be a circuit in communication with the IC 102, such as another IC (not shown) coupled to the IC 102 on a circuit board (not shown) or the like. Alternatively, the tester 150 can be part of a wafer testing system (shown in FIG. 7) that tests IC 102 on a wafer before IC is sorted and packaged.

Figure 2:
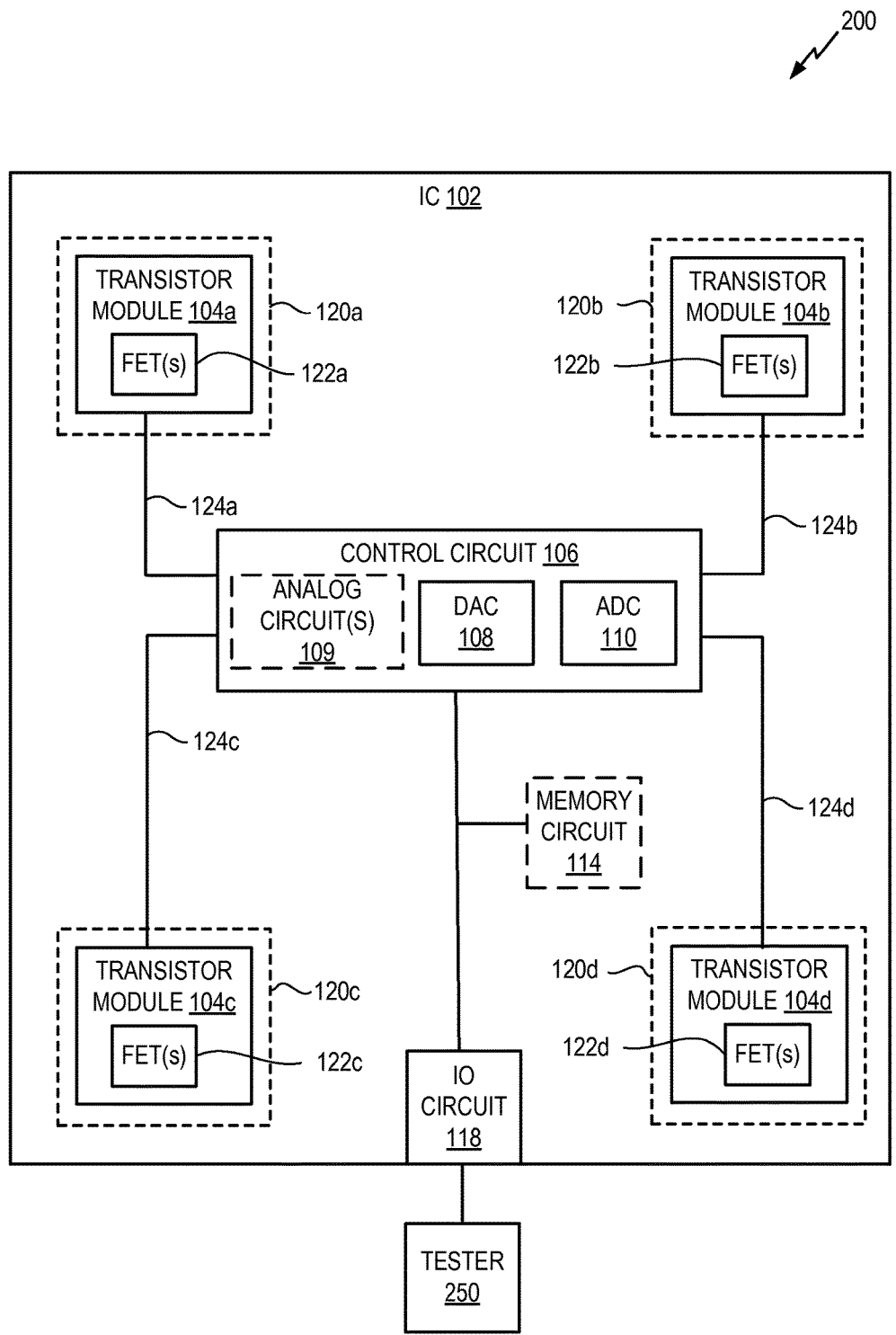
FIG. 2 is a block diagram depicting an IC test system according to another example implementation.

FIG. 2 is a block diagram depicting an IC test system 200 according to another example implementation. Elements in FIG. 2 that are the same or similar to those of FIG. 1 are designated with identical reference numerals and are described in detail above. In the present example, the test circuit 116 is omitted. The control circuit 106 can be coupled to an external tester ("tester 250") through the 10 circuit 118. The tester 250 can drive the testing process. That is, the tester 250 can cause the control circuit 106 to drive voltage signals to the transistor modules 104 and obtain test measurements in response. The tester 250 receives the test measurements from the control circuit 106 and can derive transistor characteristics from the test measurements. In an example, the IC 102 can include the memory circuit 114. The test measurements and/or transistor characteristics can be stored in the memory circuit 114, as described above.

Figure 3:
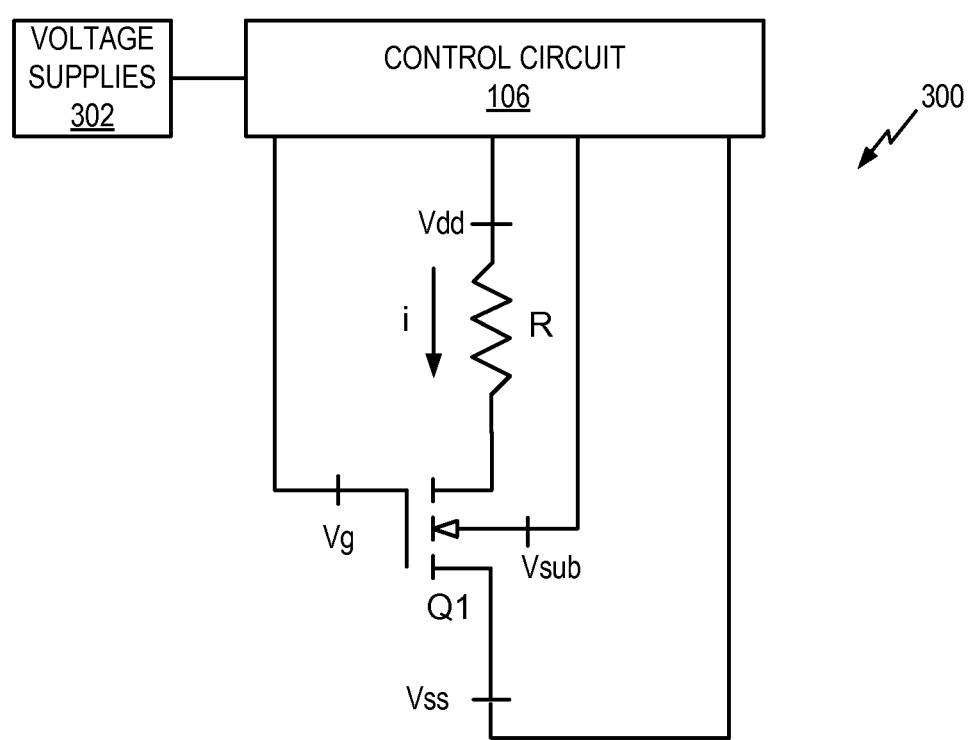
FIG. 3 is a schematic diagram depicting a test configuration according to an example implementation.

FIG. 3 is a schematic diagram depicting a test configuration 300 according to an example implementation. The test configuration 300 that includes a FET Q1 coupled to the control circuit 106. In the example, the FET Q1 is an n-channel or n-type FET comprising gate, source, drain, and body terminals coupled to the control circuit 106. A similar configuration can be employed using a p-channel or p-type FET. The control circuit 106 is configured to bias the FET Q1 by applying a gate voltage Vg to the gate, a substrate voltage Vsub to the body, a source voltage Vss to the source, and a drain voltage Vdd to the drain. The control circuit 106 can obtain the voltages from voltage supplies 302. The voltage supplies 302 can be supplies present in the IC and do not have to be special supply voltages only present for testing. A resistor R models the resistance into the drain of the FET Q1. In response to the bias, a current (i) is induced from drain to source of the FET Q1. The control circuit 106 can sample the current (i) or otherwise process the current (i) and sample the resulting analog signal. For example, the control circuit 106 can bias the FET Q1 into the saturation region and the current (i) can be a saturation current of the FET Q1. The control circuit 106 can also bias the FET Q1 in another mode or vary the bias voltages such that the FET Q1 transitions between cutoff, ohmic/triode, and saturation regions and sample the induced current signal or signal derived from the induced current signal.

The test configuration 300 is just one example of potential test configurations that can be used by the in-die transistor characterization described herein. Other test configurations can include other types of transistors, including BJTs, JFETs, MESFETs, or the like. The control circuit 106 can bias such devices accordingly and obtain samples of an induced current signal or signal derived from the induced current signal.

Figure 4:
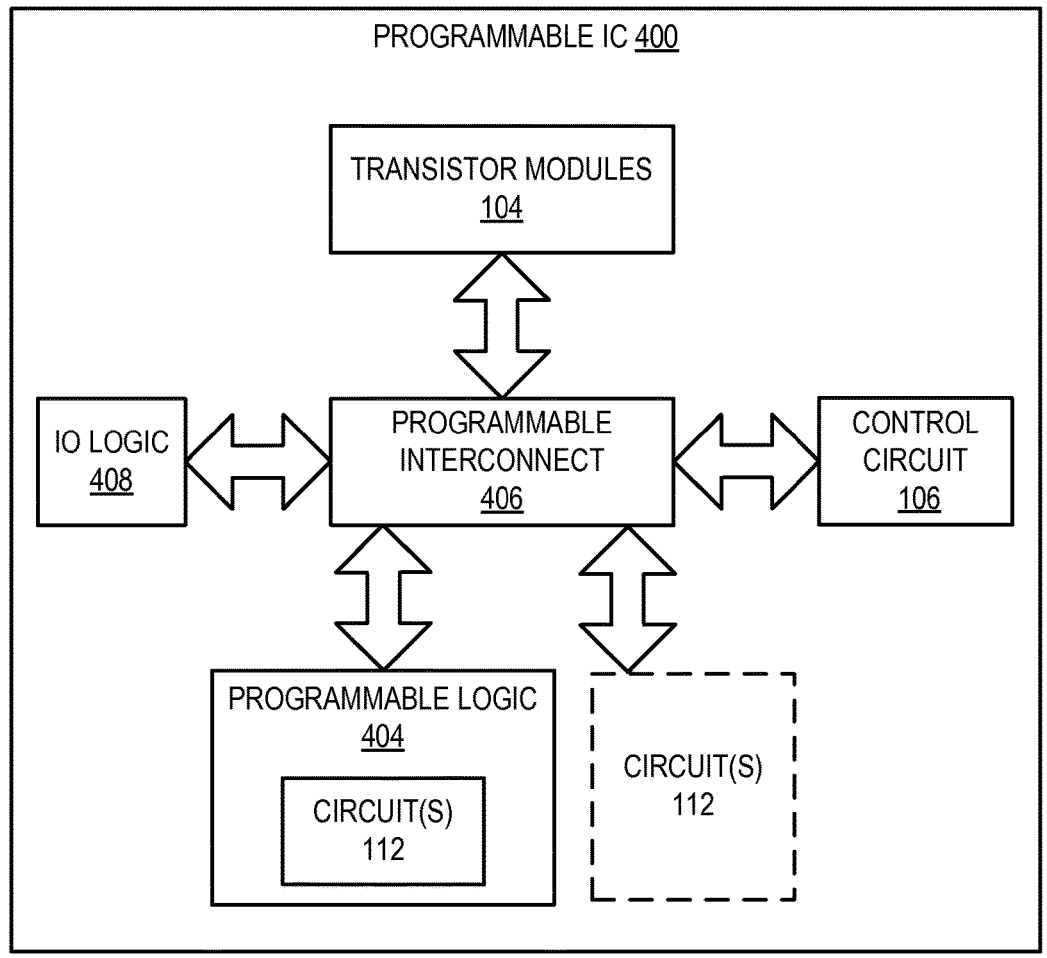
FIG. 4 is a block diagram depicting a programmable IC according to an example implementation.

FIG. 4 is a block diagram depicting a programmable IC 400 according to an example implementation. The programmable IC 400 can be a field programmable gate array (FPGA), complex programmable logic device (CPLD), or the like. The programmable IC 400 includes programmable logic 404 and programmable interconnect 406. The transistor modules 104 can be disposed in a plurality of die locations in the programmable IC 400, similar to the IC 102 described above. For purposes of clarity, the transistor modules 104 are shown logically as a single element in FIG. 4.

In the example, the transistor modules 104 are coupled to the programmable interconnect 406. Likewise, the control circuit 106 is also coupled to the programmable interconnect 406. The control circuit 106 (including the DAC 108 and the ADC 110 or the DAC 108 and the analog circuit(s) 109) can be selectively coupled to the transistor modules 104 through the programmable interconnect 406 by programming the programmable IC 400. In an example, one or more of the circuit(s) 112 can be implemented in the programmable logic 404. In another example, one or more of the circuit(s) 112 can be implemented as dedicated circuits beside the programmable logic 404. The circuit(s) 112 can be coupled to the control circuit 106 through the programmable interconnect 406. The programmable IC 400 can also include 10 logic 408. The circuit(s) 112 can be coupled to the 10 logic 408 through the programmable interconnect 406 for communicating with an external tester, as described above.

Figure 5:
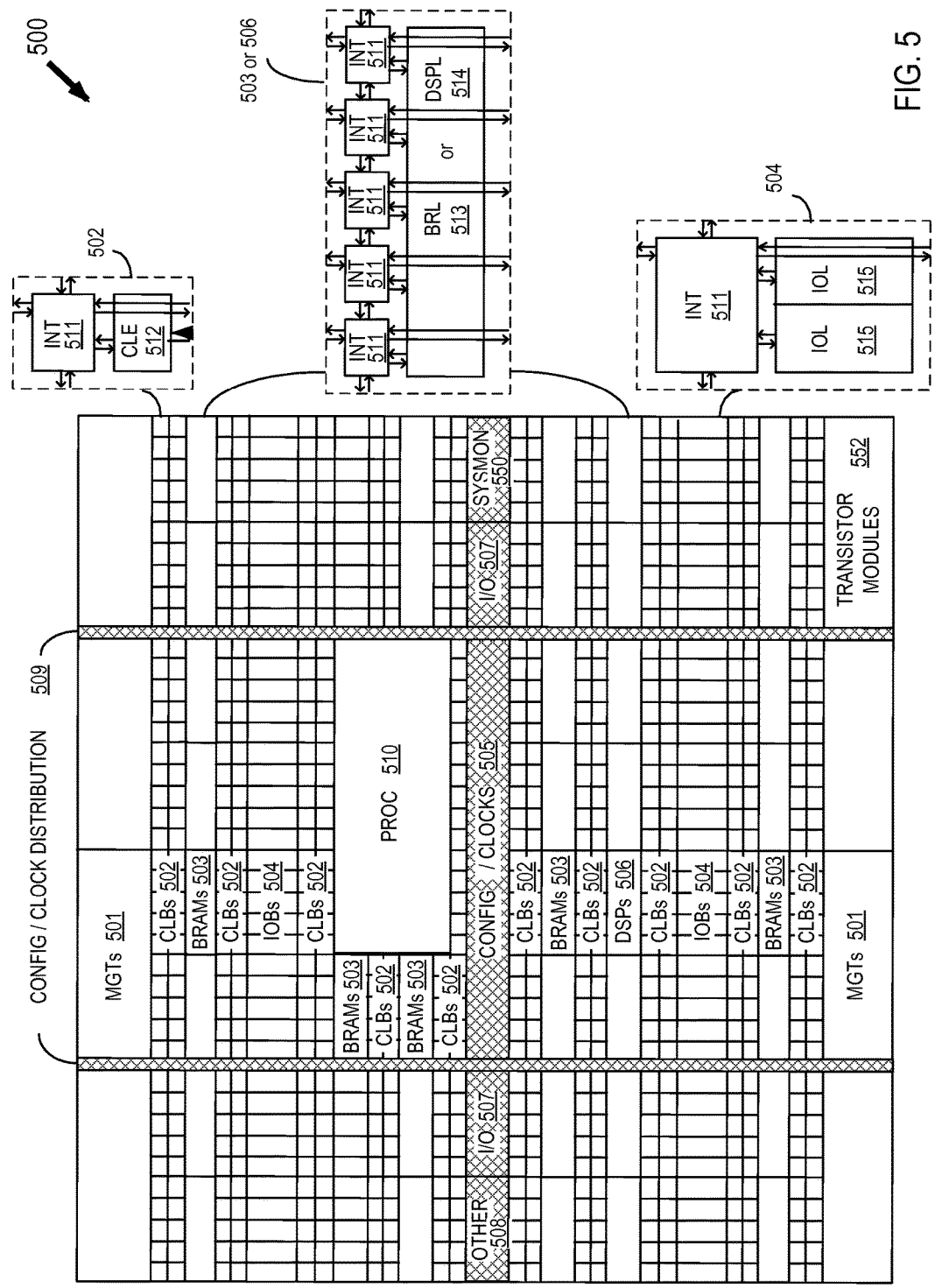
FIG. 5 illustrates a field programmable gate array (FPGA) architecture according to an example implementation.

FIG. 5 illustrates an FPGA architecture ("FPGA 500") that includes a large number of different programmable tiles including multi-gigabit transceivers ("MGTs") 501, configurable logic blocks ("CLBs") 502, random access memory blocks ("BRAMs") 503, input/output blocks ("IOBs") 504, configuration and clocking logic ("CONFIG/CLOCKS") 505, digital signal processing blocks ("DSPs") 506, specialized input/output blocks ("I/O") 507 (e.g., configuration ports and clock ports), and other programmable logic 508 such as digital clock managers, analog-to-digital converters, system monitoring logic, and so forth. Some FPGAs also include dedicated processor blocks ("PROC") 510.

In some FPGAs, each programmable tile includes a programmable interconnect element ("INT") 511 having standardized connections to and from a corresponding interconnect element in each adjacent tile. Therefore, the programmable interconnect elements taken together implement the programmable interconnect structure for the illustrated FPGA. The programmable interconnect element 511 also includes the connections to and from the programmable logic element within the same tile, as shown by the examples included at the top of FIG. 5.

For example, a CLB 502 can include a configurable logic element ("CLE") 512 that can be programmed to implement user logic plus a single programmable interconnect element ("INT") 511. A BRAM 503 can include a BRAM logic element ("BRL") 513 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 506 can include a DSP logic element ("DSPL") 514 in addition to an appropriate number of programmable interconnect elements. An 10B 504 can include, for example, two instances of an input/output logic element ("IOL") 515 in addition to one instance of the programmable interconnect element 511. As will be clear to those of skill in the art, the actual I/O pads connected, for example, to the I/O logic element 515 typically are not confined to the area of the input/output logic element 515.

In the pictured example, a horizontal area near the center of the die (shown in FIG. 5) is used for configuration, clock, and other control logic. Vertical columns 509 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block 510 spans several columns of CLBs and BRAMs.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

The FPGA 500 can also include a system monitor circuit (SYSMON) 550, and one or more transistor modules 552. The SYSMON 550 can include circuits for implementing the control circuit 106 described above. For example, the SYSMON 550 can include a DAC and an ADC. In some examples, the SYSMON 550 can include other analog circuit(s) for performing analog signal processing, as described above. The transistor modules 552 can be configured substantially as described above. The SYSMON 550 can be coupled to the transistor modules 552 through the programmable interconnect, or through dedicated routing. The transistors in the transistor modules 552 can be dedicated transistors used for the purpose of transistor characterization, or can be part of other circuitry in the FPGA 500.

Figure 6:
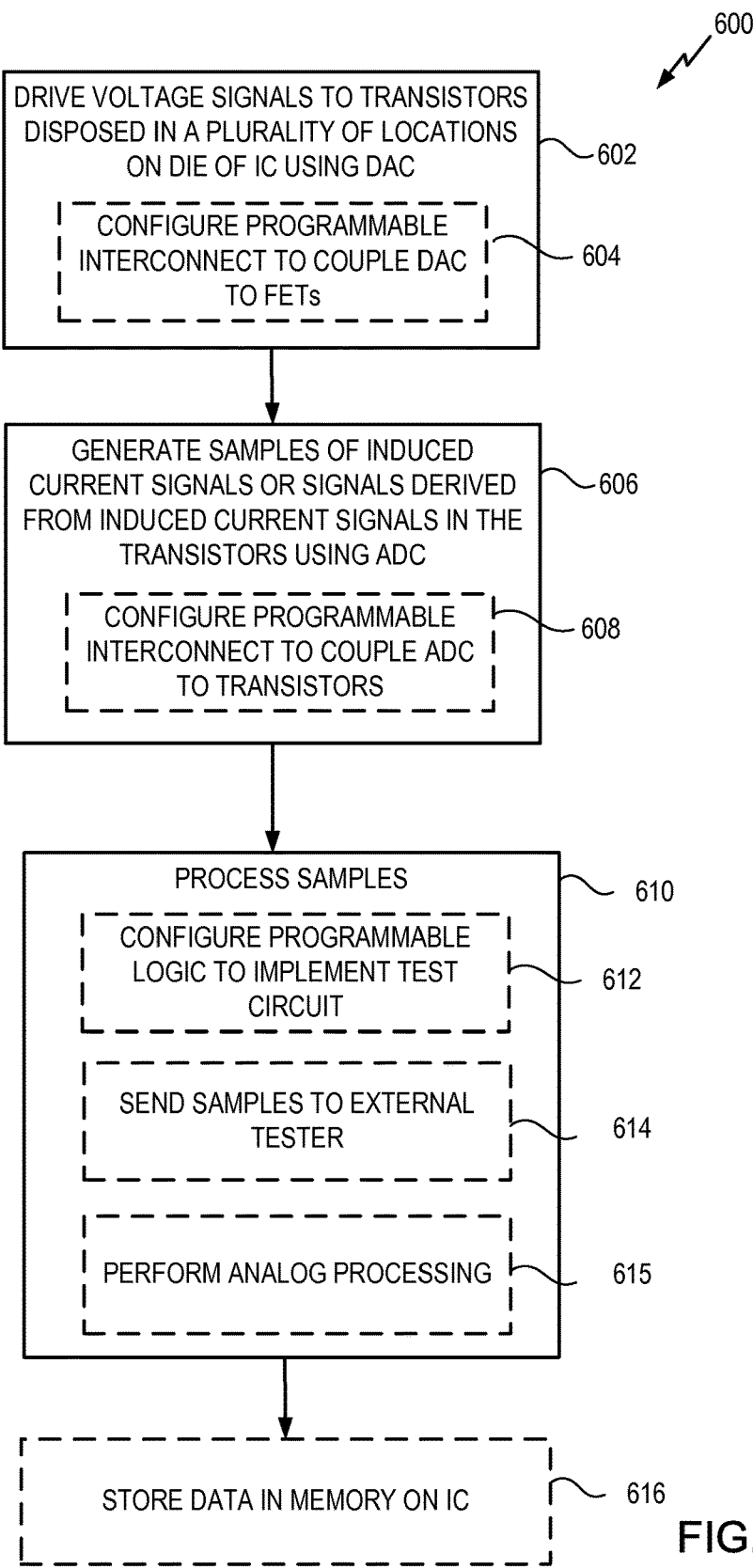
FIG. 6 is a flow diagram depicting a method of testing an integrated circuit according to an example implementation.

FIG. 6 is a flow diagram depicting a method 600 of testing an integrated circuit according to an example implementation. The method 600 begins at step 602, where transistors disposed in a plurality of die locations of the IC are driven with voltage signals using a DAC. In one example, at step 604, programmable interconnect of the IC can be configured to couple the DAC to the transistors. Alternatively, the DAC can be coupled to the transistors with dedicated routing and step 604 can be omitted.

At step 606, samples of induced current signals or signals derived from induced current signals are generated using an ADC. In one example, at step 608, programmable interconnect of the IC can be configured to couple the ADC to the transistors. Alternatively, the ADC can be coupled to the transistors with dedicated routing and step 608 can be omitted.

At step 610, the samples are processed to derive transistor characteristics. In an example, at step 612, programmable logic of the IC can be configured to implement at test circuit for causing the driving of voltage and the generation of samples. The test circuit can also determine the transistor characteristics. Alternatively or in addition to step 612, at step 614, the samples can be sent to an external tester. In an optional step 615, analog processing can be performed on the samples (e.g., analog filtering as discussed above). In an example, at step 616, the samples and/or transistor characteristics can be stored in a memory circuit of the IC. In an example, the method 600 can be performed on the IC while the IC is on a wafer. In another example, the method 600 can be performed on the IC after the IC is sorted and packaged.

Figure 7:
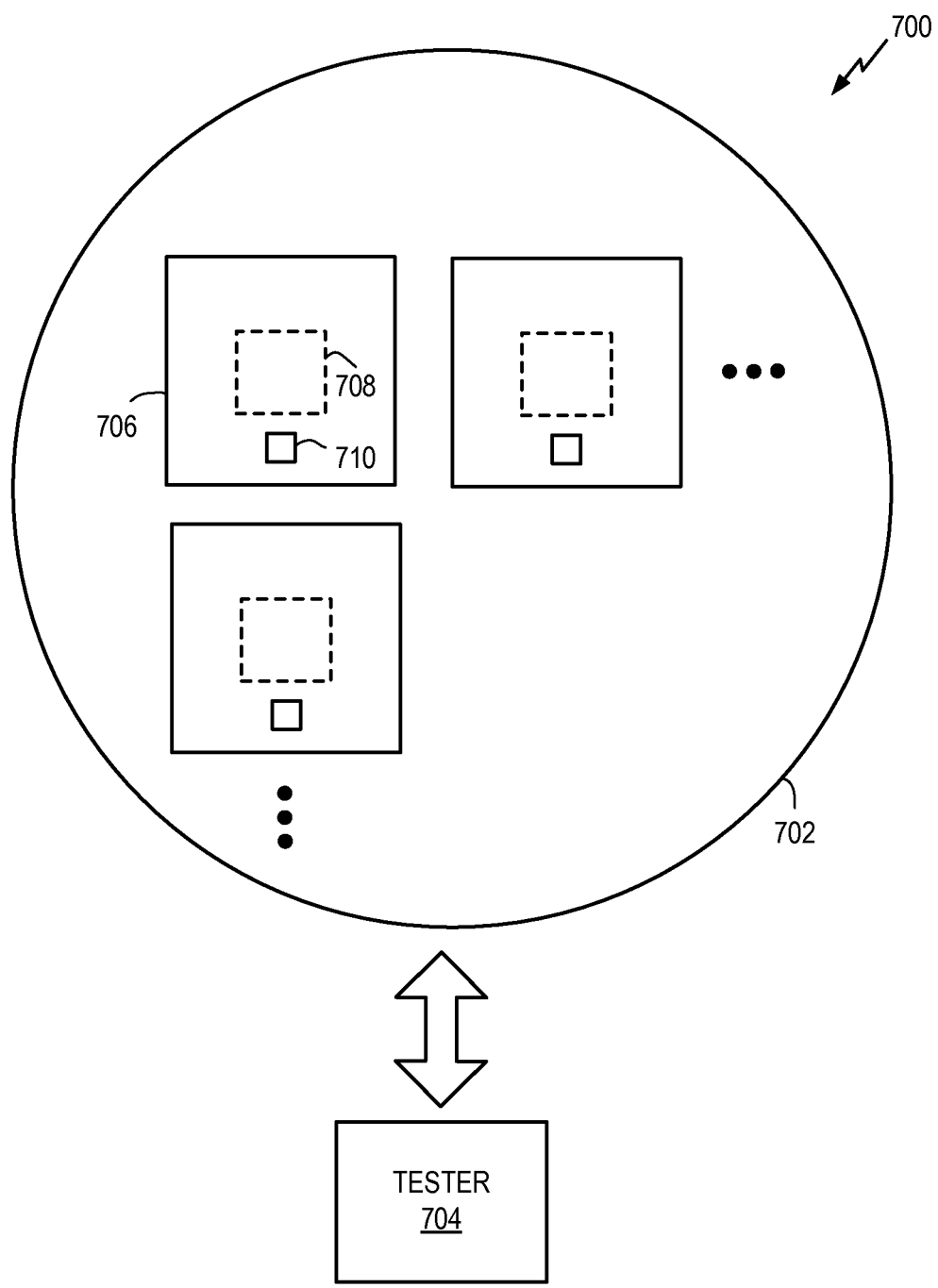
FIG. 7 is a block diagram depicting a test system according to an example implementation.

FIG. 7 is a block diagram depicting a test system 700 according to an example implementation. The test system 700 includes a wafer 702 and a tester 704. The wafer 702 includes a plurality of IC dice 706. Each IC die 706 includes an in-die transistor characterization circuit 708 and at least one contact 710 coupled to the in-die transistor characterization circuit 708. The in-die transistor characterization circuit 708 can be configured according to the various examples described above. The tester 704 can be coupled to the contact(s) 710 on each IC die 706 to control the testing process, including receiving test measurements and/or transistor characteristics from the in-die transistor characterization circuit 708.

While the foregoing is directed to specific examples, other and further examples may be devised without departing from the basic scope thereof, and the scope thereof is determined by the claims that follow.

What is claimed is:

1. An integrated circuit (IC), comprising:
   programmable logic, and programmable interconnect coupled to the programmable logic, formed on a die of the IC;
   a plurality of transistors disposed in a plurality of locations on the die of the IC and coupled to the programmable interconnect;
   conductors coupled to terminals of each of the plurality of transistors;
   a digital-to-analog converter (DAC), disposed on the die of the IC and coupled to the conductors, to drive the plurality of transistors with voltage signals in response to a digital input;
   an analog-to-digital converter (ADC), disposed on the die of the IC and coupled to at least a portion of the conductors, to generate samples in response to current signals induced in the plurality of transistors in response to the voltage signals, the samples being indicative of at least one electrostatic characteristic for the plurality of transistors; and
   a test circuit coupled to the ADC to receive the samples, the test circuit configured in the programmable logic of the IC.

2. The IC of claim 1, further comprising:
   at least one contact configured for probing by a tester, the at least one contact coupled to the ADC to output the samples.

3. The IC of claim 1, further comprising:
   a memory circuit coupled to the ADC to store the samples.

4. The IC of claim 1, wherein the test circuit is configured to derive the at least one electrostatic characteristic for the plurality of transistors from the samples.

5. The IC of claim 4, wherein a first measurement of the at least one electrostatic characteristic derived from a first sample for a first transistor in a first location exhibits variation as compared to a second measurement of the at least one electrostatic characteristic derived from a second sample for a second transistor in a second location.

6. The IC of claim 1, wherein the conductors are part of the programmable interconnect of the IC.

7. The IC of claim 1, further comprising:
   at least one analog circuit configured to generate analog signals derived from the induced current signals;
   wherein the ADC generates samples of the analog signals.

8. A system to test an integrated circuit (IC) having programmable logic coupled to programmable interconnect formed on a die of the IC, the system comprising:
- a plurality of transistor modules disposed in a plurality of locations on the die of the IC and coupled to the programmable interconnect;
- a control circuit on the die of the IC and coupled to the plurality of transistor modules, configured to drive the plurality of transistor modules to obtain test measurements; and
- a test circuit on the die of the IC and coupled to the control circuit, configured to derive transistor characteristics from the test measurements, wherein the test circuit is configured in the programmable logic.

9. The system of claim 8, wherein the plurality of transistor modules include at least one transistor.

10. The system of claim 8, wherein the control circuit comprises:
- a digital-to-analog converter (DAC), coupled to the plurality of transistor modules, to provide voltage signals; and
- an analog-to-digital converter (ADC), coupled to the plurality of transistor modules, to generate samples in response to induced current signals.

11. The system of claim 8, wherein the control circuit is coupled to the plurality of transistor modules through the programmable interconnect of the IC.

12. A method of testing an integrated circuit (IC) having programmable logic coupled to programmable interconnect formed on a die of the IC, the method comprising:
- driving voltage signals to a plurality of transistors, disposed in a plurality of locations on the die of the IC and coupled to the programmable interconnect, using a digital-to-analog converter (DAC) on the IC;
- generating samples in response to induced current signals in the plurality of transistors in using an analog-to-digital converter (ADC) on the die of the IC;
- configuring the programmable logic of the IC to implement a test circuit;
- receiving the samples at the test circuit; and
- deriving at least one electrostatic characteristic for the plurality of transistors from the samples.

13. The method of claim 12, further comprising:
- configuring programmable interconnect of the IC to selectively couple the DAC and ADC to the plurality of transistors.

14. The method of claim 12, performing the steps of driving and generating after the IC has been sorted and packaged.

15. The method of claim 12, wherein the step of deriving the at least one electrostatic characteristic for the plurality of transistors from the samples is performed by the test circuit.

16. The method of claim 15, wherein a first measurement of the at least one electrostatic characteristic derived from a first sample for a first transistor in a first location exhibits variation as compared to a second measurement of the at least one electrostatic characteristic derived from a second sample for a second transistor in a second location.

* * * * *